US00RE49519E

(19) United States
(12) Reissued Patent
Stuhlberger et al.

(10) Patent Number: US RE49,519 E
(45) Date of Reissued Patent: May 2, 2023

(54) GENERATION OF FAST FREQUENCY RAMPS

(71) Applicant: Infineon Technologies AG, Neubiberg (DE)

(72) Inventors: Rainer Stuhlberger, Puchenau (AT); Lukas Heschl, Linz (AT)

(73) Assignee: Infineon Technologies AG, Neubiberg (DE)

(21) Appl. No.: 17/313,352

(22) Filed: May 6, 2021

Related U.S. Patent Documents

Reissue of:

(64) Patent No.: 10,320,402
Issued: Jun. 11, 2019
Appl. No.: 15/843,589
Filed: Dec. 15, 2017

(30) Foreign Application Priority Data

Dec. 16, 2016 (DE) ..... 10 2016 124 656.5
Oct. 18, 2017 (DE) ..... 10 2017 124 343.7

(51) Int. Cl.
*H03L 7/099* (2006.01)
*H03L 7/14* (2006.01)
*H03G 3/30* (2006.01)
*H03L 7/081* (2006.01)
(Continued)

(52) U.S. Cl.
CPC ..... *H03L 7/146* (2013.01); *G01S 7/35* (2013.01); *H03C 3/095* (2013.01); *H03C 3/0925* (2013.01);
(Continued)

(58) Field of Classification Search
None
See application file for complete search history.

(56) References Cited

U.S. PATENT DOCUMENTS 6,114,985 A * 9/2000 Russell ..... G01S 7/4052 342/173
6,515,553 B1 * 2/2003 Filiol ..... H03C 3/0925 332/127
(Continued)

OTHER PUBLICATIONS

Riley, Tom A. D.,Copeland, Miles A. & Kwasniewski, Tad A., "Delta-Sigma Modulation in Fractional-N Frequency Synthesis". IEEE Journal of Solid-State Circuits. vol. 28, No. 5. May 1993, pp. 553-559. doi: 10.1109/4.229400.

*Primary Examiner* — John M Hotaling
(74) *Attorney, Agent, or Firm* — Harrity & Harrity, LLP

(57) ABSTRACT

A circuit includes an RF oscillator coupled in a phase-locked loop. The phase-locked loop is configured to receive a digital input signal, which is a sequence of digital words, and to generate a feedback signal for the RF oscillator based on the digital input signal. The circuit further includes a digital-to-analog conversion unit that includes a pre-processing stage configured to pre-process the sequence of digital words and a digital-to-analog-converter configured to convert the pre-processed sequence of digital words into the analog output signal. The circuit includes circuitry configured to combine the analog output signal and the feedback signal to generate a control signal for the RF oscillator. The pre-processing stage includes a word-length adaption unit configured to reduce the word-lengths of the digital words and a sigma-delta modulator coupled to the word-length adaption unit downstream thereof and configured to modulate the sequence of digital words having reduced word-lengths.

19 Claims, 4 Drawing Sheets

(51) Int. Cl.

| | |
|---|---|
| ***H03L 7/10*** | (2006.01) |
| ***G01S 7/35*** | (2006.01) |
| ***G01S 13/34*** | (2006.01) |
| ***G01S 13/93*** | (2020.01) |
| ***H03C 3/09*** | (2006.01) |
| ***H03L 7/093*** | (2006.01) |
| ***H03L 7/197*** | (2006.01) |
| *G01S 13/931* | (2020.01) |

(52) U.S. Cl.
CPC ..... *H03C 3/0941* (2013.01); *H03G 3/3047* (2013.01); *H03L 7/0814* (2013.01); *H03L 7/0816* (2013.01); *H03L 7/093* (2013.01); *H03L 7/101* (2013.01); *H03L 7/1976* (2013.01); *G01S 13/343* (2013.01); *G01S 2013/9321* (2013.01)

(56) References Cited

U.S. PATENT DOCUMENTS 6,683,557 B2 * 1/2004 Pleva ..... H01Q 3/24 342/28
7,994,957 B2 8/2011 O'Donnell et al.
8,654,006 B2 * 2/2014 Landez ..... G01S 7/032 342/134
8,731,502 B2 5/2014 Salle et al.
9,397,675 B1 * 7/2016 Goodson ..... H03M 3/32
9,547,071 B2 * 1/2017 Vaucher ..... G01S 7/02
10,469,095 B2 * 11/2019 Lin ..... G01S 13/06
11,424,539 B2 * 8/2022 Alpman ..... H05K 1/0218
2003/0185288 A1 * 10/2003 Hinrichs ..... H04L 5/023 375/216
2006/0068737 A1 * 3/2006 Koo ..... H03L 7/1976 455/260
2007/0152859 A1 * 7/2007 Reefman ..... H03M 3/50 341/144
2008/0146173 A1 * 6/2008 Nariman ..... H04B 1/0483 455/126
2010/0328124 A1 12/2010 O'Donnell et al.
2011/0298506 A1 12/2011 Salle et al.
2013/0129114 A1 * 5/2013 Lesso ..... H03L 7/08 381/98
2018/0191302 A1 * 7/2018 Saric ..... H03L 7/197
2019/0319582 A1 * 10/2019 Heschl ..... H03B 5/1243

* cited by examiner

GENERATION OF FAST FREQUENCY RAMPS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

FIELD

The present disclosure relates to the field of radio frequency (RF) circuits. Some embodiments relate to the phase locked loop (PLL) included in a local oscillator of a radar RF frontend and to the control of the PLL for generating fast ramp signals.

BACKGROUND

Radio frequency (RF) transceivers can be found in numerous applications, particularly in the field of wireless communications and radar sensors. In the automotive sector, there is an increasing demand for radar sensors used in so-called "adaptive cruise control" (ACC) or "radar cruise control" systems. Such systems may be used to automatically adjust the speed of an automobile so as to maintain a safe distance from other automobiles ahead.

Modern radar systems make use of highly integrated RF circuits, which may incorporate all core functions of an RF frontend of a radar transceiver in one single package (single chip transceiver). Such RF frontends usually include, inter alia, a local RF oscillator (LO), power amplifiers (PA), and low-noise amplifiers (LNA) mixers.

Frequency-modulated continuous-wave (FMCW) radar systems use radar signals whose frequency is modulated by ramping the signal frequency up and down. Such radar signals are often referred to as "chirp signals" or simply as chirps, wherein frequency is ramped up in an up-chirp and ramped down in a down-chirp. For generating such chirp signals the radar transmitter may include a local oscillator, which includes a voltage-controlled oscillator (VCO) connected in a phase-locked loop (PLL). The frequency of the VCO may be controlled by adjusting the frequency division ratio of a frequency divider arranged in the feedback loop of the PLL. To keep the phase noise of the local oscillator output signal low, the band-width of the PLL should be low. However, a low band-width contradicts the goal of generating chirp signals with steep frequency ramps.

SUMMARY

A circuit is described herein. In accordance with one embodiment, the circuit includes an RF oscillator coupled in a phase-locked loop. The phase-locked loop is configured to receive a digital input signal, which is a sequence of digital words, and to generate a feedback signal for the RF oscillator based on the digital input signal. The circuit further includes a digital-to-analog conversion unit configured to receive the digital input signal and to generate an analog output signal. The digital-to-analog conversion unit includes a pre-processing stage configured to pre-process the sequence of digital words and a digital-to-analog-converter configured to convert the pre-processed sequence of digital words into the analog output signal. Furthermore, the circuit includes circuitry configured to combine the analog output signal and the feedback signal to generate a control signal for the RF oscillator. Thereby the pre-processing stage includes a word-length adaption unit configured to reduce the word-lengths of the digital words in the sequence of digital words and further includes a sigma-delta modulator coupled to the word-length adaption unit and configured to modulate the sequence of digital words having reduced word-lengths.

A further embodiment relates to a phase locked loop (PLL) circuit, which includes a voltage-controlled oscillator configured to generate an RF oscillator signal based on a control voltage.

The PLL circuit further includes a feedback loop configured to provide a feedback signal based on the RF oscillator signal. The feedback loop includes a fractional-N frequency divider, a phase detector, and a loop filter. The division ratio of the fractional-N frequency divider is set based on a digital input signal which is a sequence of digital words.

Furthermore, the PLL circuit includes a digital-to-analog conversion unit configured to receive the digital input signal and to generate an analog output signal. The digital-to-analog conversion unit includes a pre-processing stage configured to pre-process the sequence of digital words and a digital-to-analog-converter configured to convert the pre-processed sequence of digital words into the analog output signal. The PLL circuit further includes circuitry configured to combine the analog output signal and the feedback signal to generate the control voltage. Thereby, the pre-processing stage includes a word-length adaption unit configured to reduce the word-lengths of the digital words in the sequence of digital words and further includes a sigma-delta modulator coupled to the word-length adaption unit downstream thereof and configured to modulate the sequence of digital words having reduced word-lengths.

Moreover, a method for a PLL is described herein. In accordance with one embodiment the method includes generating an RF oscillator signal with an RF oscillator that is coupled in a PLL, wherein the PLL is configured to generate a feedback signal for the RF oscillator based on a digital input signal, which is a sequence of digital words. The method further includes converting the digital input signal to an analog output signal and combining the analog output signal and the feedback signal to generate a control signal for the RF oscillator. Thereby, converting the digital input signal to an analog output signal includes reducing the word-lengths of the digital words in the sequence of digital words, sigma-delta modulating the sequence of digital words with reduced bit length, and converting the modulated sequence to obtain the analog output signal.

BRIEF DESCRIPTION OF THE DRAWINGS

The following description can be better understood with reference to the following drawings and descriptions. The components in the figures are not necessarily to scale. Instead, emphasis is placed upon illustrating the principles of the embodiments as described below. More-over, in the figures, like reference numerals designate corresponding parts. In the drawings.

DETAILED DESCRIPTION

Embodiments are discussed below in the context of a radar transceiver. It should be noted, however, that the following description may also be applied in applications different from radar such as, for example, RF transceivers of RF communication devices. In fact, almost any RF circuitry includes a local oscillator for generating an RF signal.

Figure 1:
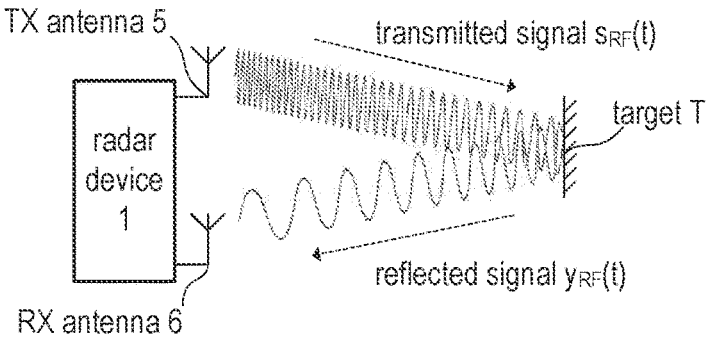
FIG. 1 illustrates the operating principle of a frequency-modulated continuous-wave (FMCW) radar system for distance and/or velocity measurement according to one or more embodiments.

FIG. 1 illustrates a frequency-modulated continuous-wave (FMCW) radar device 1. In the present example, separate transmit (TX) and receive (RX) antennas 5 and 6, respectively, are used. However, it is noted that a single antenna can be used so that the receive antenna and the transmit antenna are physically the same (monostatic radar configuration). The transmit antenna continuously radiates an RF signal $s_{RF}(t)$, which is frequency-modulated, for example, by a saw-tooth signal (periodic linear ramp signal). The transmitted signal $s_{RF}(t)$ is back-scattered at a target T, which is located in the radar channel within the measurement range of the radar device, and the back-scattered signal $y_{RF}(t)$ is received by the receive antenna 6. The back-scattered signal is denoted as $y_{RF}(t)$.

Figure 2:
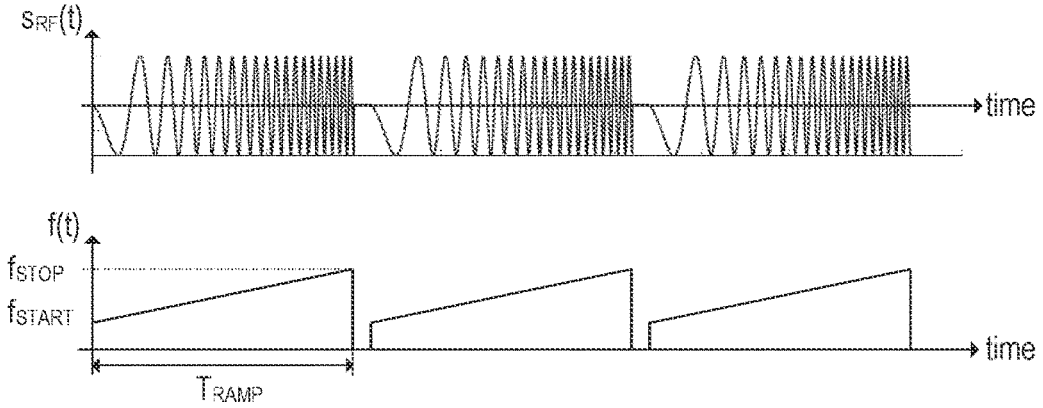
FIG. 2 includes two timing diagrams illustrating a frequency modulation of a radio frequency (RF) signal used in FMCW radar systems according to one or more embodiments.

FIG. 2 illustrates the mentioned frequency-modulation of the signal $s_{RF}(t)$. As shown in the first diagram of FIG. 2, the signal $s_{RF}(t)$ is composed of a series of "chirps", i.e. a sinusoidal waveform with increasing (up-chirp) or decreasing (down-chirp). In the present example, the instantaneous frequency f(f) of a chirp increases linearly from a start frequency fSTART to a stop frequency fSTOP within a defined time span TRAMP (see second diagram of FIG. 2). Such a chirp is also referred to as a linear frequency ramp. Three identical linear frequency ramps are illustrated in FIG. 2. It is noted, however, that the parameters fSTART, fSTOP, TRAMP as well as the pause between the individual frequency ramps may vary dependent on the actual implementation of the radar device 1. In practice the frequency variation may be, for example, linear (linear chirp, frequency ramp), exponential (exponential chirp) or hyperbolic (hyperbolic chirp).

Figure 3:
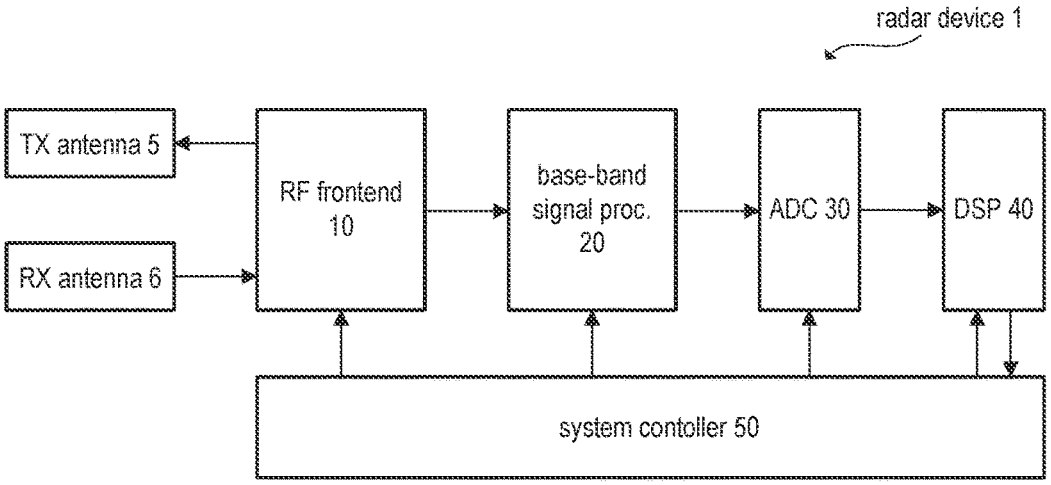
FIG. 3 is a block diagram illustrating the basic structure of a FMCW radar device according to one or more embodiments.

FIG. 3 is a block diagram that illustrates an exemplary structure of a radar device 1 (radar sensor). It is noted that a similar structure may also be found in RF transceivers used in other applications such as, for example, in wireless communications systems. Accordingly, at least one transmit antenna 5 (TX antenna) and at least one receive antenna 6 (RX antenna) are connected to an RF frontend 10, which may be integrated in a monolithic microwave integrated circuit (MMIC). The RF frontend 10 may include all the circuit components needed for RF signal processing. Such circuit components may include, for example, a local oscillator (LO), RF power amplifiers, low noise amplifiers (LNAs), directional couplers such as rat-race-couplers and circulators, and mixers for the down-conversion of RF signals (e.g. the received signal $y_{RF}(t)$, see FIG. 1) into the base-band or an IF-band. It is noted that antenna-arrays may be used instead of single antennas. The depicted example shows a bistatic (or pseudo-monostatic) radar system, which has separate RX and TX antennas. In case of a monostatic radar system, a single antenna or a single antenna array may be used for both, receiving and transmitting electromagnetic (radar) signals. In this case a directions coupler (e.g. a circulator) may be used to separate RF signals to be transmitted to the radar channel from RF signals received from the radar channel.

In case of a frequency-modulated continuous-wave (FMCW) radar system, the transmitted RF signals radiated by the TX antenna 5 are in the range between approximately 20 GHz (e.g. 24 GHz) and 81 GHz (e.g. 77 GHz in automotive applications). As mentioned, the RF signal received by the RX antenna 6 includes the radar echoes (i.e., the signal back-scattered at the so-called radar targets). The received RF signal $y_{RF}(t)$ are down-converted into the base band and further processed in the base-band using analog signal processing (see FIG. 3, base-band signal processing chain 20), which includes filtering and amplification of the base-band signal. The base-band signal is finally digitized using one or more analog-to-digital converters 30 and further processed in the digital domain (see FIG. 3, digital signal processing chain implemented, for example, in digital signal processor 40). The overall system is controlled by a system controller 50, which may be at least partly implemented using a processor such as a microcontroller executing appropriate firmware. The RF frontend 10 and the analog base-band signal processing chain 20 (and optionally the ADC 30) may be integrated in a single MMIC. However, the components may be distributed among two or more integrated circuits.

Figure 4:
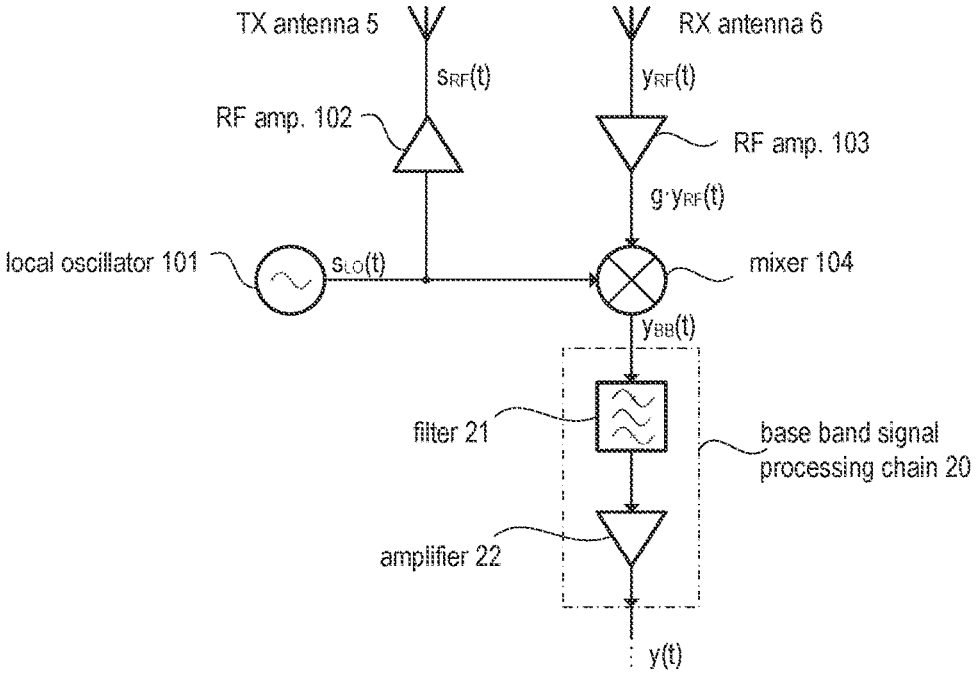
FIG. 4 is a circuit diagram illustrating an example of an analog RF frontend, which may be included in the FMCW radar device of FIG. 3, according to one or more embodiments.

FIG. 4 illustrates an exemplary implementation of the RF frontend 10, which may be included in the radar sensor shown in FIG. 3. It is noted that FIG. 4 is a simplified circuit diagram illustrating the basic structure of an RF frontend. Actual implementations, which may heavily depend on the application, are of course more complex. The RF frontend 10 includes a local oscillator 101 (LO) that generates a RF signal $s_{LO}(t)$, which may be frequency-modulated as explained above with reference to FIG. 2. The signal $s_{LO}(t)$ is also referred to as LO signal. In radar applications, the LO signal is usually in the Super High Frequency (SHF) or the Extremely High Frequency (EHF) band (e.g., between 76 GHz and 81 GHz in automotive applications).

The LO signal $s_{LO}(t)$ is processed in the transmit signal path as well as in the receive signal path. The transmit signal $s_{RF}(t)$, which is radiated by the TX antenna 5, is generated by amplifying the LO signal $s_{LO}(t)$, for example, using an RF power amplifier 102. The output of the amplifier 102 is coupled to the TX antenna 5. The received signal $y_{RF}(t)$, which is provided by the RX antenna 6, is provided to a mixer 104. In the present example, the received signal $y_{RF}(t)$ (i.e., the antenna signal) is pre-amplified by RF amplifier 103 (gain g), so that the mixer receives the amplified signal $g \cdot y_{RF}(t)$ at its RF input. The mixer 104 further receives the LO signal $s_{LO}(t)$ at its reference input and is configured to down-convert the amplified signal $g \cdot y_{RF}(t)$ into the base band. The resulting base-band signal at the mixer output is denoted as $y_{BB}(t)$. The base-band signal $y_{BB}(t)$ is further processed by the analog base band signal processing chain 20 (see also FIG. 3), which basically includes one or more filters (e.g., a band-pass 21) to remove undesired side bands and image frequencies as well as one or more amplifiers such as amplifier 22. The analog output signal, which may be supplied to an analog-to-digital converter (FIG. 3) is denoted as y(t).

In the present example, the mixer 104 down-converts the RF signal $g \cdot y_{RF}(t)$ (amplified antenna signal) into the base band. The respective base band signal (mixer output signal) is denoted by $y_{BB}(t)$. The down-conversion may be accomplished in a single stage (i.e., from the RF band into the base band) or via one or more intermediate stages (from the RF band into an IF band and subsequently into the base band). In view of the example of FIG. 4, it is clear that the quality of the radar measurement will heavily depend on the quality of the LO signal $s_{LO}(t)$. Low phase noise and steep and highly linear frequency ramps are desired properties of the LO signal $s_{LO}(t)$.

Figure 5:
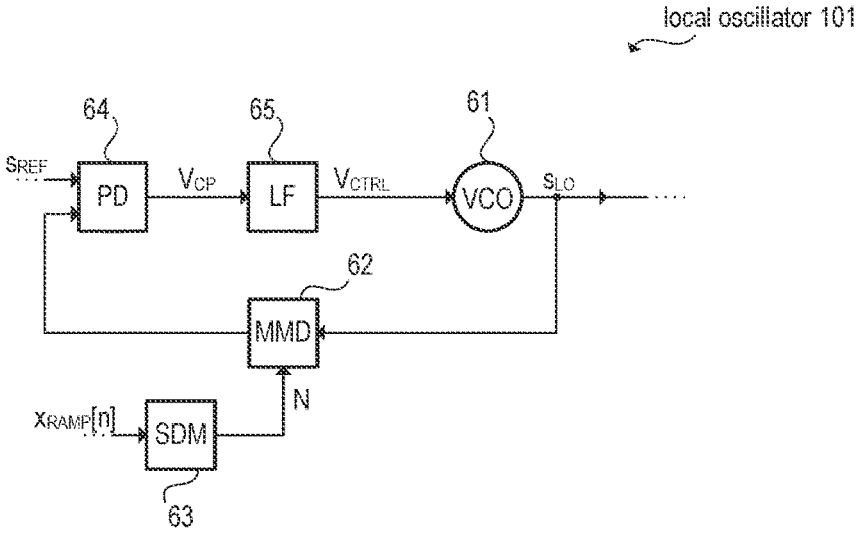
FIG. 5 is a block diagram illustrating an example of a local oscillator, which may be included in the RF frontend of FIG. 4 to generate frequency-modulated RF signals, according to one or more embodiments.

FIG. 5 illustrates an exemplary implementation of a local oscillator, such as the LO 101 in FIG. 4. The present example is a simplified circuit diagram illustrating the basic structure of an RF oscillator that includes a voltage-controlled oscillator (VCO) connected in a phase-locked loop (PLL). A VCO is an electronic oscillator whose oscillation frequency is controlled by a voltage signal $v_{CTRL}$ (control signal). The voltage applied at the control input of the VCO determines the instantaneous oscillation frequency. Consequently, the frequency of the VCO output signal (i.e., the LO signal $s_{LO}(t)$) can be modulated by appropriately modulating the control signal $v_{CTRL}(t)$, which is accomplished by the feedback loop of the PLL.

As shown in FIG. 5, the feedback loop of the PLL includes a fractional-N multi-modulus frequency divider. The fractional-N multi-modulus frequency divider is composed of a multi-modulus divider (MMD) 62 and a Σ-Δ modulator (SDM) 63, which is configured to continuously alter the (integer) frequency division ratio N so as to accomplish a rational number as effective frequency division ratio. The basic principle of such a PLL is may be known in the art.

According to the example of FIG. 5, the PLL includes a VCO 61 which generates the LO signal $s_{LO}(t)$ as output signal. The frequency of the LO signal $s_{LO}(t)$ is denoted as fLO and is set in accordance with the signal $v_{CTRL}(t)$ applied at the control input of the VCO 61. The LO signal $s_{LO}(t)$ is supplied to MMD 62, which has a selectable (integer) division ratio N. That is, MMD 62 is configured to reduce the frequency supplied to its input by a factor N and to generate a divider output signal $s_{PLL}(t)$ having a frequency denoted as $f_{PLL}$, wherein $f_{LO}=N \cdot f_{PLL}$. The division ratio N is selectable dependent on a signal supplied to a select input of MMD 62. The output signal $s_{PLL}(t)$ (frequency $f_{PLL}$) of MMD 62 is also referred to as PLL clock signal. In a radar application the RF oscillator frequency fLO may be between 76 GHz and 81 GHz, while the PLL clock signal $s_{PLL}(t)$ may have a PLL clock frequency $f_{PLL}$ in a range from 160 MHz to 200 MHz. Instead of directly supplying the LO signal $s_{LO}(t)$ to MMD 62, it may be pre-divided by a constant division ratio (see also FIG. 7, frequency divider 72).

The frequency divider output signal $s_{PLL}(t)$ as well as a reference signal $s_{REF}(t)$, which has a frequency denoted as fREF, are supplied to a phase detector (PD) 64, also known as phase comparator. Dependent on the implementation a phase-frequency-detector (PFD) may be employed instead. Phase detectors as well as phase-frequency detectors are commonly used in the field of PLLs and therefore not further discussed in more detail. The reference signal $s_{REF}(t)$ may be generated by a reference oscillator or generated based on the signal of a reference oscillator (e.g., a quartz oscillator), for example, by frequency division or frequency multiplication (see also FIG. 7, quartz oscillator 70).

The output signal $v_{CP}(t)$ of PD 64 is usually generated by a charge-pump included in the output stage of the PD. The output signal $v_{CP}(t)$ may be regarded as an error signal that is filtered by a loop filter (LF) 65, which determines the band-with of the control loop. The output signal of LF 65 is used as control signal $v_{CTRL}(t)$ to adjust the oscillation frequency fLO of VCO 61, thus closing the control loop. The closed loop ensures that the frequency fLO is continuously tuned to such a value that the phases of the divider output signal $s_{PLL}(t)$ and the reference signal $s_{REF}(t)$ match. That is, the phase is "locked." Various implementations of phase detectors and phase-frequency-detectors including charge-pumps are as such known in the art and thus not further discussed herein in more detail.

Generally, the division ratio N used by MMD 62 is an integer number. To accomplish a non-integer division ratio, the integer ratio N may be modulated by a sigma-delta (Σ-Δ) modulator such that the average (and effective) division ratio is a rational number. The SDM 63 may be clocked by the PLL clock signal $s_{PLL}(t)$ (clock frequency $f_{PLL}$) and is supplied with a (e.g. digital) input value $x_{RAMP}[n]$, which represents a rational number within a defined interval (e.g., between 0 and 1 or between 0 and 2). The values N generated at the output of SDM 63 are integer values, which have an average value equal to the input values $x_{RAMP}$. Dependent on the actual implementation, an integer offset value may be added to the modulator output signal (not shown in FIG. 5). In each clock cycle of the PLL clock signal $s_{PLL}(t)$, the MMD 62 receives an updated division ratio N in accordance with the SDM output. Usually Σ-Δ modulators are used which have a 3rd order multi stage noise shaping (MASH) structure, also referred to as MASH3 modulators.

Figure 6:
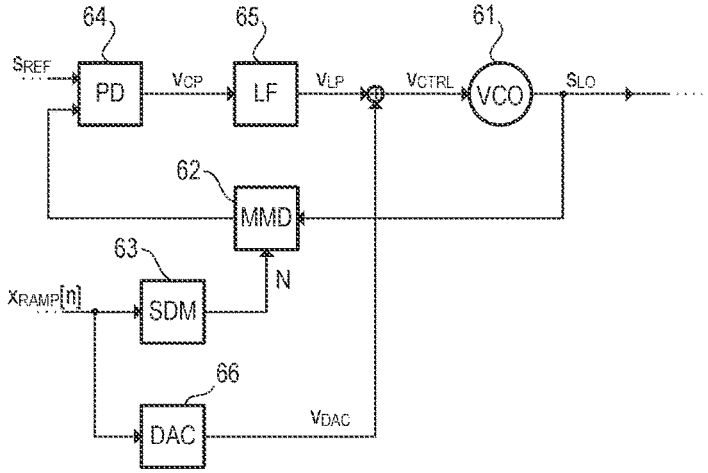
FIG. 6 is a block diagram illustrating another example of a local oscillator, which may be used to generate steep frequency ramps (chirps), according to one or more embodiments.

By appropriately tuning the (effectively rational) division ratio N used by the MMD 62, a frequency modulation of the LO signal $s_{LO}(t)$ may be accomplished. As mentioned above, a frequency modulation is particularly used to generate chirps or frequency ramps. For an accurate measurement the phase noise included in the LO signal $s_{LO}(t)$ and the linearity of the frequency ramps have to comply with defined specifications, which are tested in an end-of-line test during production of the radar devices. FIG. 6 illustrates another exemplary implementation of a local oscillator, which utilizes a VCO connected in a PLL. In essence, the example of FIG. 6 is identical with the previous example of FIG. 5 except that an additional digital-to analog converter 66 (DAC) is provided to improve the response of the local oscillator to fast frequency variations. That is, the DAC helps to make the step response of the PLL faster.

According to the example of FIG. 6, the DAC 66 is supplied with the digital ramp signal $x_{RAMP}[n]$, which is, for example, a 31-bit word representing the desired instantaneous frequency LO signal $s_{LO}(t)$ (PLL output signal).

Moreover, the digital ramp signal $x_{RAMP}[n]$ is supplied to the input of SDM 63 and processed as already explained with regard to the previous example of FIG. 5. However, in addition to varying the effective division ratio of MMD 62, the digital ramp signal $x_{RAMP}[n]$ is converted to an analog signal $v_{DAC}(t)$ that is added to the output signal vLF(t) of LF 65. The sum signal, which is denoted as $v_{CTRL}(t)$ is supplied to the control input of VCO 61. The circuit node, at which the summation $vLF(t)+v_{DAC}(t)$ takes place, is also referred to as high-pass point, as the transfer characteristics from the output of DAC 66 to the VCO frequency fLO is a high-pass characteristic. Thus, fast frequency variations can be effected by the DAC output signal $v_{DAC}(t)$ while band-width of the PLL. Small frequency variations can be effected by the PLL, and thus the band-width of the PLL, which is mainly determined by the transfer characteristics of LF 65, may be determined comparably narrow, which reduces phase noise and improves linearity of the frequency control.

In the embodiments described herein, the frequency fLO of the LO signal $s_{LO}(t)$ is in the SHF or EHF band, for example in the range from 76 to 81 GHz in case of automotive radar systems. The frequency $f_{PLL}$ (PLL clock frequency) of the MMD output signal $s_{PLL}(t)$ may be, for example, 200 MHz. The digital ramp signal $x_{RAMP}[n]$ is a sequence of 31-bit words. In some applications (e.g., automotive radar sensors) a word-length of 31 bits or even more may be needed to meet the desired specifications concerning frequency resolution and linearity of the frequency control of the VCO frequency fLO. When using a PLL structure as shown in FIG. 6, these parameters (31 bit word-length at 200 MHz PLL frequency) would entail a rather complex and expensive design of the DAC unit 66, which is hard to integrate in the same chip as the RF frontend.

Figure 7:
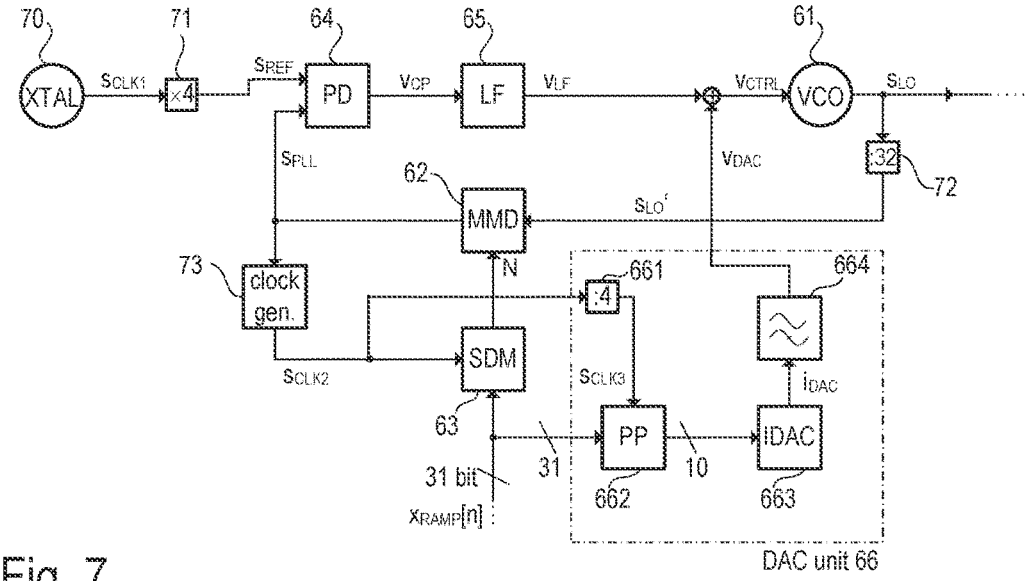
FIG. 7 is a block diagram illustrating an example of local oscillator, which may be used to generate steep frequency ramps (chirps), according to one or more embodiments.

FIG. 7 is a block diagram illustrating one embodiment of an improved PLL local oscillator, which may be used to generate steep frequency ramps (chirps) with high linearity. The circuit of FIG. 7 is essentially the same as the circuit of FIG. 6. However, one exemplary implementation of the DAC unit 66 is illustrated in more detail. Furthermore, one exemplary implementation of the clock signal generation is shown in FIG. 7. Accordingly, a system clock signal $s_{CLK1}(t)$ is generated using a reference oscillator such as a quartz oscillator (system clock frequency $f_{CLK1}$). This system clock signal $s_{CLK1}(t)$ is supplied to a frequency multiplier 71, which generates an output signal having a frequency that is an integer multiple of the system clock frequency $f_{CLK1}$. In the present example the integer multiple is 4 and the output signal of the frequency multiplier 71 is supplied as reference signal $s_{REF}(t)$ to PD 64 as explained above with reference to FIG. 5 and FIG. 6. In one illustrative example, the system clock frequency $f_{CLK1}$ may be 50 MHz and the frequency fREF of the PLL reference signal $s_{REF}(t)$ is thus 200 MHz. Different to the previous examples, the LO signal $s_{LO}(t)$ is frequency-divided by a fixed factor (e.g., pre-division by factor 32) before supplied to MMD 62. The variable division ratio of the MMD is correspondingly lower (e.g., between 8 and 15). In an illustrative example, the LO signal $s_{LO}(t)$ of 80 GHz (76.8 GHz) may pre-divided to 2.5 GHz (2.4 GHz), and the MMD may provide a further division by a factor 12.5 (12) to generate the PLL clock frequency fPLL of 200 MHz.

The SDM 63 included in the Fractional-N Divider as well as the DAC unit 66 are clocked by a clock signal $s_{CLK2}(t)$ (frequency $f_{CLK2}$) which is based on the PLL clock signal $s_{PLL}(t)$. The signal clock signal $s_{CLK2}(t)$ is generated by clock generator 73 and is in synchronization with the PLL clock signal $s_{PLL}(t)$, thus $f_{CLK2}=f_{PLL}$. In the present example of FIG. 7, the clock signal $s_{CLK2}$ (t) is supplied to the SDM 63 and the DAC unit 66. In the above-mentioned illustrative example, the frequency $f_{CLK2}$ would be substantially 200 MHz.

As mentioned above, the digital ramp signal $x_{RAMP}[n]$, which is supplied as input signal to the DAC unit 66, is a sequence of digital words having a word-length of, for example, 31 bit, wherein the digital words are provided at a rate corresponding to $f_{CLK2}$ (e.g., 200 MHz). In the present example, the DAC unit 66 includes a frequency divider 661 that downscales the frequency $f_{CLK2}$ of signal $s_{CLK2}(t)$ by a fixed integer factor (e.g., factor 4) thus generating a clock signal $s_{CLK3}(t)$ with the lower clock frequency $f_{CLK3}$. In the above-mentioned illustrative example, the frequency $f_{CLK3}$ would be substantially 50 MHz. Other components of the DAC unit 66 are clocked with the reduced clock frequency $f_{CLK3}$. Thus, the digital ramp signal $x_{RAMP}[n]$ is decimated by a factor $f_{CLK2}/f_{CLK3}$ (e.g., 4 in the present example).

Further, the DAC unit includes a digital pre-processing stage 662, which pre-processes the digital ramp signal $x_{RAMP}[n]$ before it is supplied to the digital-to analog-converter. Accordingly, the digital pre-processing stage 662 is configured to decimate the digital input signal by a factor that corresponds to the division ratio of frequency divider 661 (e.g., factor 4 in the present example) and to reduce the word-length of the digital input signal (i.e., ramp signal $x_{RAMP}[n]$). In the present example, the word-length is reduced to, e.g., 10 bits. Thus, the sequence of 31 bit words at 200 MHz clock rate ($f_{CLK2}$) may be converted, for example, into a sequence of 10 bit words at 50 MHz ($f_{CLK3}$) clock rate. One example of the word-length reduction is explained later with reference to FIG. 8.

Referring again to FIG. 7, it is noted that the word-length reduction 10, for example, 10 bits may entail an increase of the quantization noise. However, the quantization noise may be "shifted" to higher frequencies using a further ΣΔ-modulator that may be also included in the pre-processing digital pre-processing stage 662. The ΣΔ-modulator may be implemented as a first order MASH modulator (MASH1 modulator). The shifted quantization noise may be subsequently suppressed in the analog domain by filter 664, which may be a simple first order low-pass filter. A digital-to-analog converter 663 may be disposed between the pre-processing stage 662 and the mentioned filter 664, which may be part of an analog pot-processing stage. In the present example, the digital-to-analog converter 663 may be a current-output digital-to-analog converter (IDAC) that generates an analog current signal based on the preprocessed digital input signal $x_{RAMP}[n]$. The output signal of the analog post-processing stage (e.g., filter 664) is a voltage signal and denoted as $v_{DAC}$ (t). As shown in FIG. 7, the signal $v_{DAC}(t)$ is added to the LF output signal vLF(t).

Figure 8:
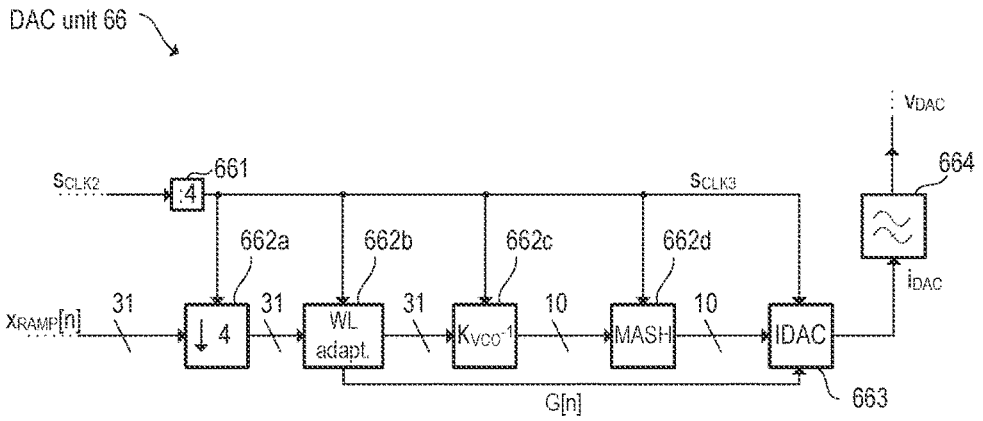
FIG. 8 is a block diagram illustrating an example implementation of a digital-to analog converter (DAC) unit used in the embodiment of FIG. 7 in more detail, according to one or more embodiments.

FIG. 8 is a block diagram illustrating one implementation of the DAC unit 66 with pre-processing stage 662 used in the embodiment of FIG. 7 in more detail. In the present example, the pre-processing stage 662 includes a decimator 662a, word-line adaption unit 662b, pre-distortion unit 662c (to compensate for the non-linear characteristics of VCI 61), and MASH modulator 662d. The output signal of the MASH modulator 662d is supplied as digital input signal to IDAC 663. As in the previous example, the post-processing stage may basically include the low-pass filter 664, which suppresses the additional quantization noise caused by the mentioned word-length reduction.

It is noted, that the order of the digital pre-processing units 662a-662c may be interchanged dependent on the actual implementation. The mentioned pre-distortion may be accomplished by applying a second order polynomial approximation of the nonlinear characteristic of VCO 61. The operation of VCO 61 may be characterized by a factor $K_{VCO}$, which denotes the ratio $f_{LO}/v_{CTRL}$. This factor is, however, not a constant but depends on the actual frequency. Applying the mentioned second order polynomial to the digital data before the ΣΔ-modulation may compensate for the non-linearity. As mentioned, the MASH modulator 662d shifts the quantization noise towards higher frequencies. However, the noise shaping properties of MASH modulators are as such known and thus not further discussed herein.

In the present example, the word-length adaption unit 662b may reduce the word-length of the digital ramp signal $x_{RAMP}[n]$ from, for example, initially 31 bit to 10 bit. A single frequency ramp (chirp) does not usually include frequencies throughout the whole modulation range. That is, the bandwidth of a chirp (fSTOP-fSTART, see FIG. 2) is significantly smaller than the whole frequency range that can be represented by the 31 bits. Thus only a portion of the 31 bits change when ramping the frequency up from fSTART to fSTOP during a single chirp. Accordingly, the word-length adaption unit 662b is configured to extract a portion of 10 subsequent bits from each 31 bit word so that the current frequency ramp (defined by fSTART and fSTOP) are covered by the extracted 10 bit word. For one specific chirp at the lower end of the possible frequency range, bit 0 (least significant bit) to bit 9 may be extracted. For another specific chirp at the upper end of the possible frequency range, bit 22 to bit 31 (most significant bit) may be extracted. Another chirp approximately in the middle of the possible frequency range, the extracted 10 bit word may be composed of bit 11 to bit 20 of the initial 31 bit word. In order to enable IDAC 663 to generate a correct analog signal, the gain G[n] of IDAC 663 may be adjusted dependent on the bit position of the extracted 10-bit word in the initial 31-bit word.

The gain G[n] of the IDAC 663 may be seen as the ratio iLSB(tn)/iMAX, wherein iLSB(tn) is the IDAC output current associated with the least significant bit of the, for example, 10 bit input word. The gain G[n] depends on the position where (at which bit position p) the digital word with reduced word-length (e.g., 10-bit word) has been extracted from the input word having the full word-length of, e.g., 31 bits. Accordingly G[n] is 2-(31-p) when the digital word of reduced word-length includes bits p to p+L−1 of the input word having the full word-length. That is, in case p=0 and L=10, the extracted 10-bit word includes bits 0 to 9 of the input word and G[n]=2-31; in case p=22 and L=10, the extracted 10-bit word includes bits 22 to 31 of the input word and G[n]=2-9; and in case p=11 and L=10, the extracted 10-bit word includes bits 11 to 21 of the input word and G[n]=2-21, etc.

Figure 9:
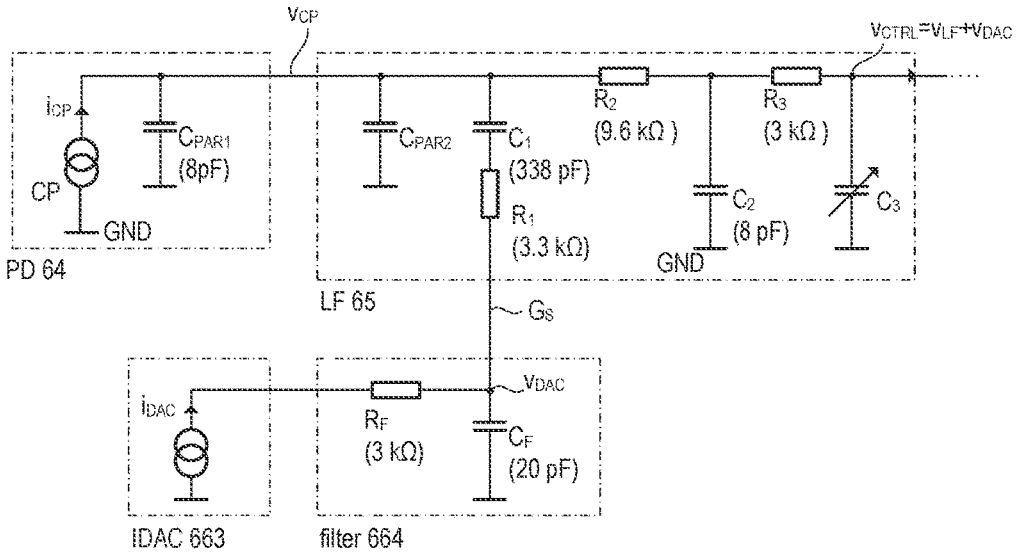
FIG. 9 is a circuit diagram illustrating an example implementation of a combination (summation) of a loop filter output signal and a DAC output signal according to one or more embodiments.

FIG. 9 illustrates one exemplary implementation of the summation of signals $v_{DAC}(t)$ and vLF(t) as shown in FIG. 7. In the example of FIG. 9, the PD 64 is represented by its output stage, which is a charge pump having a parasitic capacitor $C_{PAR1}$ connected in parallel. The charge pump may be represented by current source CP providing a current $i_{CP}$ as input signal to LF 65. The LF 65 includes parasitic capacitor $C_{PAR2}$ connected between the LF input and ground GND (reference potential). Further, LF 65 includes an integrator stage composed of capacitor $C_1$ and resistor R1 connected in series between the LF input and circuit node $G_S$. LF 65 further includes two first-order RC low-pass stages (composed of capacitors $C_2$, $C_3$ and resistors $R_2$, $R_3$, respectively) connected to the integrator stage downstream thereof. In a "normal" circuit design (e.g., in which signal $v_{DAC}(t)$ is not added to the LF output) node $G_S$ would be connected to ground GND. However, to add signal $v_{DAC}(t)$, which is provided at the output of filter 664 (see FIG. 7), the node $G_S$ is connected to the output of filter 664. Thus, the LF 65 effectively provides the sum vLF(t)+$v_{DAC}(t)$, wherein vLF(t) is the (hypothetical) loop filter output signal if $v_{DAC}(t)$ were 0V. FIG. 9 also illustrates one exemplary implementation of filter 664, which is a first order low-pass composed of capacitor $C_F$ and resistor $R_F$. IDAC 663 is represented by a current source providing the output current $i_{DAC}$.

The DAC unit 66 illustrated in FIG. 7 and FIG. 8 can be used to implement a method for adjusting the oscillation frequency of an RF oscillator (see FIG. 7, VCO 61) within a very short time. Accordingly, such a method may be used to generate very fast (steep) frequency ramps (chirps) in a radar device. In accordance with the examples described above, one exemplary method includes generating an RF oscillator signal $s_{LO}(t)$ using an RF oscillator (e.g., VCO 61) that is coupled in a PLL. The PLL is configured to generate a feedback signal (see FIG. 7, output signal vLF of loop filter 65) for the RF oscillator based on a digital input signal $x_{RAMP}[n]$, which is a sequence of digital words. The method further includes converting the digital input signal $x_{RAMP}[n]$ to an analog output signal $v_{DAC}$ (see FIG. 7, DAC unit 66), and combining/superposing the analog output signal $v_{DAC}$ and the mentioned feedback signal vLF to generate an input/control signal $v_{CTRL}$ for the RF oscillator (see, FIG. 7 and FIG. 9). Thereby, analog conversion of the digital input signal $x_{RAMP}[n]$ includes reducing the word-lengths of the digital words in the sequence of digital words (i.e. in the digital input signal $x_{RAMP}[n]$) and sigma-delta modulating the sequence of digital words with reduced bit length. The modulated sequence is then subject to an analog conversion to obtain the analog output signal $v_{DAC}$.

Although the following description may be with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond, unless otherwise indicated, to any component or structure, which performs the specified function of the described component (e.g., that is functionally equivalent), even though not structurally equivalent to the disclosed structure that performs the function in the herein illustrated exemplary implementations.

In addition, while a particular feature may have been disclosed with respect to only one of several implementations, such feature may be combined with one or more other features of the other implementations as may be desired and advantageous for any given or particular application. Furthermore, to the extent that the terms "including," "includes," "having," "has," "with," or variants thereof are used in either the detailed description and the claims, such terms are intended to be inclusive in a manner similar to the term "comprising."

What is claimed is:

[1. A phase locked loop (PLL) circuit comprising:

a voltage-controlled oscillator configured to generate a radio frequency (RF) oscillator signal based on a control voltage;

a feedback loop configured to provide a feedback signal based on the RF oscillator signal, the feedback loop comprising a fractional-N frequency divider, a phase detector and a loop filter, wherein a division ratio of the fractional-N frequency divider is set based on a digital input signal, which is a sequence of digital words; and a digital-to-analog conversion unit configured to receive the digital input signal and to generate an analog output signal, the digital-to-analog conversion unit comprising a pre-processing stage configured to pre-process the sequence of digital words, a digital-to-analog-converter configured to convert the pre-processed sequence of digital words into the analog output signal, and circuitry configured to combine the analog output signal and the feedback signal to generate the control voltage, wherein the pre-processing stage includes a word-length adaption unit configured to generate the pre-processed sequence of digital words by reducing the word-lengths of the digital words in the sequence of digital words and further includes a sigma-delta modulator coupled to the word-length adaption unit downstream thereof, the sigma-delta modulator being configured to modulate the pre-processed sequence of digital words having reduced word-lengths and output the pre-processed sequence of digital words, as modulated, to the digital-to-analog-converter.]

[2. The PLL circuit of claim 1, wherein the digital-to-analog conversion unit further comprises a post-processing stage coupled to the digital-to-analog-converter downstream thereof.]

[3. The PLL circuit of claim 2, wherein the post-processing stage comprises at least a low-pass filter.]

[4. The PLL circuit of claim 1, wherein the digital-to-analog conversion unit is a current-steering digital-to-analog converter.]

[5. The PLL circuit of claim 1, wherein the pre-processing stage further comprises a decimator configured to reduce a clock rate of the sequence of digital words by a decimation factor.]

[6. The PLL circuit of claim 1, wherein the pre-processing stage further comprises a pre-distortion unit configured to pre-distort digital information included in the sequence of digital words to compensate for a non-linear characteristic of the voltage-controlled oscillator.]

[7. The PLL circuit of claim 1, wherein the digital-to-analog conversion unit has a control input receiving an adjustable gain value, and wherein the adjustable gain value is set by the word-length adaption unit.]

[8. The PLL circuit of claim 1, wherein the word-length adaption unit is configured to reduce the word-length of the digital words of the sequence of digital words by extracting, from the digital word and at a selectable bit position of the digital word, a digital word with reduced word-length.]

[9. The PLL circuit of claim 8, wherein the word-length adaption unit is further configured to set a gain of the digital-to-analog conversion unit depending on the bit position.]

[10. The PLL circuit of claim 1, wherein the circuitry configured to combine the analog output signal and the feedback signal is part of the loop filter.]

[11. The PLL circuit of claim 10, wherein the output of the digital-to-analog conversion unit is coupled to an integrator stage of the loop filter.]

[12. The PLL circuit of claim 11, wherein the integrator stage of the loop filter is coupled between an input of the loop filter and a reference circuit node, to which the analog output signal of the digital-to-analog conversion unit is supplied.]

[13. A method comprising:

generating an RF oscillator signal using an RF oscillator that is coupled in a phase-locked loop, the phase-locked loop configured to generate a feedback signal for the RF oscillator based on a digital input signal, which is a sequence of digital words;

converting the digital input signal to an analog output signal, wherein the converting comprises reducing word-lengths of the digital words in the sequence of digital words, sigma-delta modulating the sequence of digital words having reduced word-lengths, and converting the modulated sequence of digital words of reduced word-lengths to obtain the analog output signal; and combining the analog output signal and the feedback signal to generate a control signal for the RF oscillator.]

[14. The method of claim 13, further comprising:

reducing a clock rate of the sequence of digital words by a decimation factor.]

[15. The method of claim 13, further comprising:

pre-distorting digital information included in the sequence of digital words to compensate for a non-linear characteristic of the RF oscillator.]

[16. The method of claim 13, further comprising:

filtering the analog output signal.]

17. A circuit comprising:

an RF oscillator coupled in a phase-locked loop, the phase-locked loop configured to receive a digital input signal, which is a sequence of digital words, [and to] generate *an RF oscillator signal based on a control signal derived from the digital input signal, and generate* a feedback signal for the RF oscillator based on *the RF oscillator signal and* the digital input signal; and

[a digital-to-analog conversion unit configured to receive the digital input signal and to generate an analog output signal, the digital-to-analog conversion unit comprising a pre-processing stage configured to pre-process the sequence of digital words and a digital-to-analog-converter configured to convert the pre-processed sequence of digital words into the analog output signal, and circuitry configured to combine the analog output signal and the feedback signal to generate a control signal for the RF oscillator,]

*a compensation circuit comprising a pre-processing stage configured to receive and pre-process the sequence of digital words to generate an output signal, and circuitry configured to combine the output signal and the feedback signal to generate the control signal for the RF oscillator,* wherein the pre-processing stage includes a word-length adaption [unit] *processing circuit* configured to generate the pre-processed sequence of digital words by reducing [the] word-lengths of the digital words in the sequence of digital words and further includes a sigma-delta modulator coupled to the word-length adaption [unit] *processing circuit* downstream thereof, the sigma-delta modulator being configured to modulate the pre-processed sequence of [sequence of] digital words having reduced word-lengths and output the pre-processed sequence of digital words, as modulated[, to the digital-to-analog-converter].

18. The circuit of claim 17, wherein the phase-locked loop comprises a feedback loop configured to receive [an] *the* RF oscillator signal and to provide the feedback signal *based on the RF oscillator signal*, the feedback loop comprising a fractional-N frequency divider configured to effect a division ratio, which is based on the digital input signal.

19. The circuit of claim 18, wherein the feedback loop further comprises a phase detector and a loop filter that provides the feedback signal at its output.

20. The circuit of claim 18, wherein the pre-processing stage further comprises a decimator configured to reduce a clock rate of the sequence of digital words by a decimation factor.

*21. A circuit, comprising:*

*a phase locked loop (PLL) configured to generate frequency modulated RF signals, the PLL comprising:*

*a first loop path between a phase comparator and an RF output of the PLL, the first loop path comprising an RF oscillator; and*

*a multi-modulus divider arranged in a feedback loop of the PLL;*

*a first input to receive a digital input signal comprising a sequence of digital words related to frequency ramps of the frequency modulated RF signals;*

*a first control path coupled to the first input and the multi-modulus divider, the first control path comprising a first sigma-delta modulator configured to generate a control signal for the multi-modulus divider to alter a division ratio of the multi-modulus divider based on the sequence of digital words; and*

*a second control path coupled to the first input and the first loop path, the second control path comprising a pre-processing stage, the pre-processing stage comprising a pre-distortion processing circuit and a second sigma-delta modulator, wherein the pre-distortion processing circuit is configured to compensate for a non-linear characteristic of the RF oscillator.*

*22. The circuit of claim 21, wherein an output of the pre-distortion processing circuit is coupled to an input of the second sigma-delta modulator.*

*23. The circuit of claim 21, wherein the pre-processing stage comprises a word-length adaption processing circuit configured to reduce a word-length of the sequence of digital words.*

*24. The circuit of claim 23, wherein the word-length adaption processing circuit is configured to reduce the word-length of the digital words in the sequence of digital words by extracting reduced digital words having a reduced word-length from the digital words at a selectable bit position in the digital words.*

*25. The circuit of claim 23, wherein the word-length adaption processing circuit is configured to generate a processed sequence of digital words by reducing the word-lengths of the digital words in the sequence of digital words.*

*26. The circuit of claim 25, wherein the second sigma-delta modulator is configured to receive the processed sequence of digital words, modulate the processed sequence of digital words having reduced word-lengths, and output the processed sequence of digital words, as modulated.*

*27. The circuit of claim 26, wherein the RF oscillator is controlled based on the modulated processed sequence of digital words output by the second sigma-delta modulator.*

*28. The circuit of claim 25, wherein the pre-processing stage further comprises a decimator configured to reduce a clock rate of the processed sequence of digital words by a decimation factor.*

*29. The circuit of claim 21, wherein the pre-processing stage further comprises a decimator configured to reduce a clock rate of the sequence of digital words by a decimation factor.*

*30. The circuit of claim 21, wherein the second sigma-delta modulator is a multi-stage noise shaping (MASH) sigma-delta modulator.*

*31. A circuit, comprising:*

*a phase locked loop (PLL) configured to generate frequency modulated RF signals, the PLL comprising:*

*a first loop path between a phase comparator and an RF output of the PLL, the first loop path comprising an RF oscillator; and*

*a multi-modulus divider arranged in a feedback loop of the PLL;*

*a first input to receive a digital input signal comprising a sequence of digital words related to frequency ramps of the frequency modulated RF signals;*

*a first control path coupled to the first input and the multi-modulus divider, the first control path comprising a first sigma-delta modulator configured to generate a control signal for the multi-modulus divider to alter a division ratio of the multi-modulus divider based on the sequence of digital words; and*

*a second control path coupled to the first input and the first loop path, the second control path comprising a pre-processing stage, the pre-processing stage comprising a word-length adaption processing circuit configured to generate a processed sequence of digital words by reducing the word-lengths of the digital words in the sequence of digital words and comprising a pre-distortion processing circuit configured to compensate for a non-linear characteristic of the RF oscillator.*

*32. The circuit of claim 31, further comprising:*

*a second sigma-delta modulator in the second control path, wherein the second sigma-delta modulator is configured to receive the processed sequence of digital words, modulate the processed sequence of digital words having reduced word-lengths and output the processed sequence of digital words, as modulated.*

*33. The circuit of claim 32, wherein the RF oscillator is controlled based on the modulated processed sequence of digital words output by the second sigma-delta modulator.*

*34. The circuit of claim 31, wherein the pre-processing stage further comprises a decimator configured to reduce a clock rate of the sequence of digital words or the processed sequence of digital words by a decimation factor.*

*35. The circuit of claim 31, wherein the word-length adaption processing circuit is configured to reduce the word-length of the digital words in the sequence of digital words by extracting reduced digital words having a reduced word-length from the digital words at a selectable bit position in the digital words.*

* * * * *